United States Patent
Kim et al.

(10) Patent No.: US 9,081,226 B2
(45) Date of Patent: Jul. 14, 2015

(54) LIGHT-EMITTING MODULE

(71) Applicant: Samsung Display Co., Ltd., Gyeonggi-do (KR)

(72) Inventors: Jung-Hyun Kim, Seoul (KR); Young-Min Park, Hwaseong-si (KR); Seok-Won Kang, Yongin-si (KR); Young-Hye Son, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 13/653,231

(22) Filed: Oct. 16, 2012

(65) Prior Publication Data

US 2013/0258683 A1 Oct. 3, 2013

(30) Foreign Application Priority Data

Mar. 29, 2012 (KR) .......... 10-2012-0032107
Sep. 11, 2012 (KR) .......... 10-2012-0100646

(51) Int. Cl.
*G02F 1/1335* (2006.01)
*H05K 1/18* (2006.01)
*H05K 1/02* (2006.01)

(52) U.S. Cl.
CPC .... *G02F 1/133603* (2013.01); *G02F 1/133608* (2013.01); *H05K 1/182* (2013.01); *H05K 1/021* (2013.01); *H05K 1/189* (2013.01); *H05K 2201/10106* (2013.01)

(58) Field of Classification Search
USPC ........ 362/382, 373, 547, 555; 349/61, 62, 65, 349/69
See application file for complete search history.

(56) References Cited

U.S. PATENT DOCUMENTS

| | | | | |
|---|---|---|---|---|
| 4,394,679 A * | 7/1983 | Hawrylo | ........................ | 257/99 |
| 5,130,761 A * | 7/1992 | Tanaka | ............... | 257/88 |
| 6,428,189 B1 * | 8/2002 | Hochstein | .................... | 362/373 |
| 6,517,218 B2 * | 2/2003 | Hochstein | .................... | 362/294 |
| 6,597,018 B2 * | 7/2003 | Nei | ................ | 257/79 |
| 6,825,894 B2 * | 11/2004 | Aoyagi et al. | .................. | 349/61 |
| 6,930,332 B2 * | 8/2005 | Hashimoto et al. | ............ | 257/98 |
| 7,192,163 B2 * | 3/2007 | Park | ............................ | 362/294 |
| 7,202,920 B2 * | 4/2007 | Aoyagi et al. | .................. | 349/62 |
| 7,218,041 B2 * | 5/2007 | Isoda | ............. | 313/11 |
| 7,285,802 B2 * | 10/2007 | Ouderkirk et al. | ............. | 257/98 |
| 7,441,925 B2 * | 10/2008 | Chou et al. | ................... | 362/294 |
| 7,486,348 B2 * | 2/2009 | Aoyagi et al. | .................. | 349/61 |
| 7,677,899 B2 * | 3/2010 | Low | ............................. | 439/56 |
| 7,679,918 B2 * | 3/2010 | Kim | ............................. | 361/719 |
| 7,714,954 B2 * | 5/2010 | Aoyagi et al. | .................. | 349/61 |
| 7,932,969 B2 * | 4/2011 | Hong | ............................. | 349/69 |
| 7,997,749 B2 * | 8/2011 | Kim et al. | .................... | 362/97.3 |

(Continued)

FOREIGN PATENT DOCUMENTS

KR  10-2007-0076220  7/2007
KR  10-2011-0092809  8/2011

*Primary Examiner* — Thomas A Hollweg
(74) *Attorney, Agent, or Firm* — Innovation Counsel LLP (57) ABSTRACT

A light-emitting module includes a printed circuit board (PCB) and a light emitting package. A hole is formed through the PCB. The light emitting package has a light source and a lead, and is disposed on the PCB. The light emitting package has a stepped portion having predetermined height. The stepped portion is disposed in the hole formed through the PCB. Thus, a thickness of the light-emitting module may be decreased, reliability of the light-emitting module may be enhanced, and thus a thickness and a bezel of a display apparatus may be decreased.

21 Claims, 12 Drawing Sheets

(56) References Cited

U.S. PATENT DOCUMENTS

| | | | |
|---|---|---|---|
| 8,044,341 B2 | 10/2011 | Saito | |
| 8,324,724 B2 * | 12/2012 | Wu et al. | 257/709 |
| 2001/0030866 A1 * | 10/2001 | Hochstein | 362/294 |
| 2004/0047151 A1 * | 3/2004 | Bogner et al. | 362/236 |
| 2004/0065894 A1 * | 4/2004 | Hashimoto et al. | 257/100 |
| 2004/0095782 A1 * | 5/2004 | Isoda | 362/555 |
| 2004/0262717 A1 * | 12/2004 | Arndt et al. | 257/666 |
| 2004/0264195 A1 * | 12/2004 | Chang et al. | 362/294 |
| 2005/0068471 A1 * | 3/2005 | Aoyagi et al. | 349/62 |
| 2006/0250270 A1 * | 11/2006 | Tangen | 340/815.45 |
| 2007/0081313 A1 * | 4/2007 | Tanaka et al. | 361/767 |
| 2007/0146572 A1 * | 6/2007 | Aoyagi et al. | 349/62 |
| 2007/0176198 A1 * | 8/2007 | Lee et al. | 257/99 |
| 2008/0170415 A1 * | 7/2008 | Han et al. | 362/612 |
| 2009/0116252 A1 * | 5/2009 | Kille et al. | 362/373 |
| 2009/0122231 A1 * | 5/2009 | Aoyagi et al. | 349/65 |
| 2009/0179219 A1 * | 7/2009 | Kim et al. | 257/99 |
| 2009/0213583 A1 * | 8/2009 | Chang et al. | 362/218 |
| 2009/0296394 A1 * | 12/2009 | Wang | 362/249.02 |
| 2010/0220463 A1 * | 9/2010 | Kim et al. | 362/97.3 |
| 2011/0198628 A1 | 8/2011 | Kim | |
| 2011/0242797 A1 * | 10/2011 | Park et al. | 362/97.3 |
| 2012/0025257 A1 * | 2/2012 | Wu et al. | 257/99 |

* cited by examiner

LIGHT-EMITTING MODULE

PRIORITY STATEMENT

This application claims priority under 35 U.S.C. §119 to Korean Patent Applications No. 10-2012-0032107, filed on Mar. 29, 2012 and No. 10-2012-0100646, filed on Sep. 11, 2012 in the Korean Intellectual Property Office (KIPO), the contents of which are herein incorporated by reference in their entireties.

BACKGROUND OF THE INVENTION

1. Field of the Invention

Embodiments of the present invention relate to a light-emitting module. More particularly, embodiments of the present invention relate to a light-emitting module used in a display apparatus.

2. Description of the Related Art

Recently, a light emitting diode (LED) is widely used in a display apparatus such as a liquid crystal display apparatus, an electrophoretic display apparatus and Micro-Electro-Mechanical-System (MEMS) display apparatus.

Usually, the LED is mounted on a printed circuit board (PCB). A protecting material protecting the LED is formed around the LED, and an encapsulation portion encapsulating the LED to protect the LED is formed on the LED.

When a height of the protecting material and a height of the encapsulation portion are decreased, reliability of the LED is degraded, and thus there is a limit to decrease a thickness of a light-emitting module including the PCB and the LED.

Thus, a technique for decreasing the thickness of the light-emitting module and enhancing the reliability of the light-emitting module is required.

SUMMARY OF THE INVENTION

Example embodiments of the present invention provide a light-emitting module having decreased thickness and enhanced reliability.

According to an exemplary embodiment of the present invention, a light-emitting module includes a printed circuit board (PCB) and a light emitting package. A hole is formed through the PCB. The light emitting package has a light source and a lead, and is disposed on the PCB. The light emitting package has a stepped portion having predetermined height. The stepped portion is disposed in the hole formed through the PCB.

In one embodiment, the lead may include a main lead portion, a first bending portion extending downwardly from the main lead portion, and a second bending portion formed at an end of the first bending portion and extending parallel to the main lead portion, and the light source may be disposed on the second bending portion.

In one embodiment, the stepped portion may be at least formed below the light source.

In one embodiment, a height of the stepped portion may be substantially same to a total thickness of the lead and the PCB.

In one embodiment, the stepped portion may be at least formed below the light source.

In one embodiment, a height of the stepped portion may be substantially same to a total thickness of the lead and the PCB.

In one embodiment, a height of the stepped portion may be substantially same to a total thickness of the lead and the PCB.

In one embodiment, the light source may be covered by a protecting material, and a thickness of the protecting material on an upper surface of the light source and on a lower surface of the lighting source may be substantially same.

In one embodiment, the light emitting package may include a lead frame, the lead frame may have a portion bent downwardly from the lead and have a portion parallel to the lead at the end of the portion bent downwardly, and the light source may be disposed on the portion parallel to the lead.

In one embodiment, the stepped portion may be at least formed below the light source.

In one embodiment, a height of the stepped portion may be substantially same to a total thickness of the lead and the PCB.

In one embodiment, the stepped portion may be at least formed below the light source.

In one embodiment, a height of the stepped portion may be substantially same to a total thickness of the lead and the PCB.

In one embodiment, a height of the stepped portion may be substantially same to a total thickness of the lead and the PCB.

In one embodiment, the light source may be covered by a protecting material, and a thickness of the protecting material on an upper surface of the light source and on a lower surface of the lead may be substantially same.

In one embodiment, the light emitting package may include a lead frame and the lead frame may have a portion bent downwardly from the lead and have a portion parallel to the lead at the end of the portion bent downwardly, and the light source may be disposed on the portion parallel to the lead.

In one embodiment, the stepped portion may be at least formed below the light source.

In one embodiment, a height of the stepped portion may be substantially same to a total thickness of the lead and the PCB.

In one embodiment, the stepped portion may be at least formed below the light source.

In one embodiment, a height of the stepped portion may be substantially same to a total thickness of the lead and the PCB.

In one embodiment, a height of the stepped portion may be substantially same to a total thickness of the lead and the PCB.

According to the present invention, a thickness of the light-emitting module may be decreased, reliability of the light-emitting module may be enhanced, and thus a thickness and a bezel of the display apparatus may be decreased.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Hereinafter, the present invention will be explained in detail with reference to the accompanying drawings.

Figure 1A:
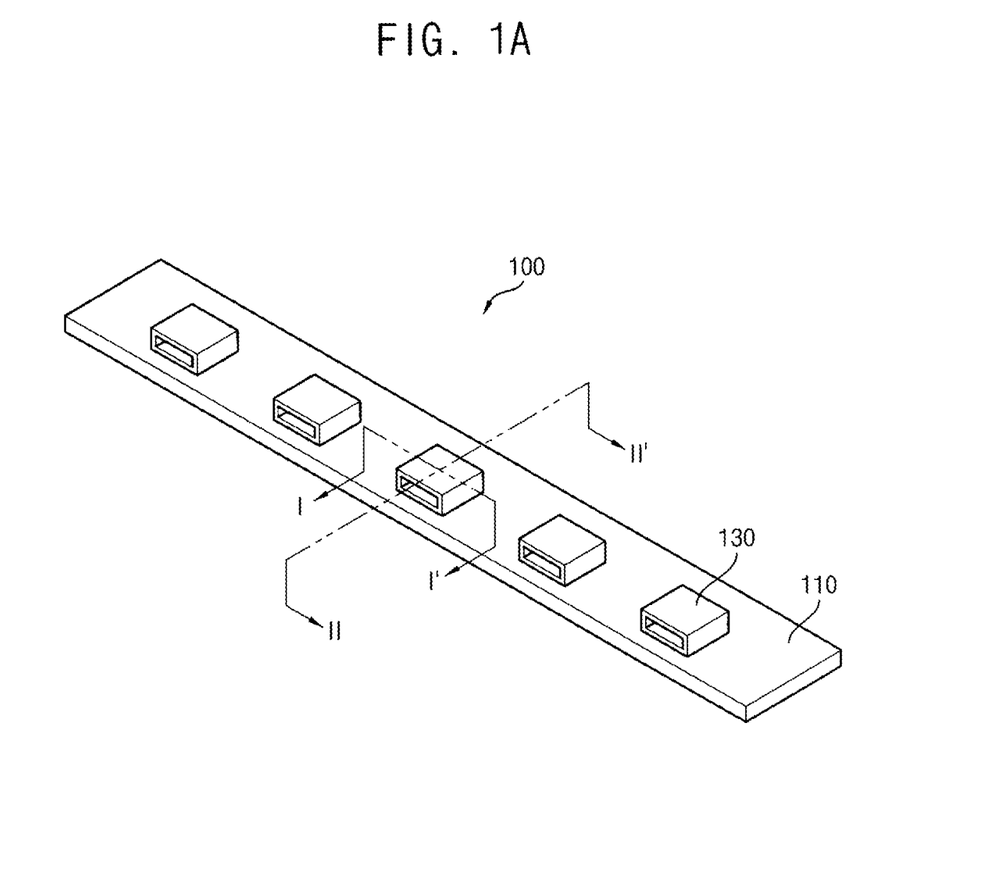
FIG. 1A is a perspective view illustrating a light-emitting module according to an example embodiment of the present invention.
Figure 1B:
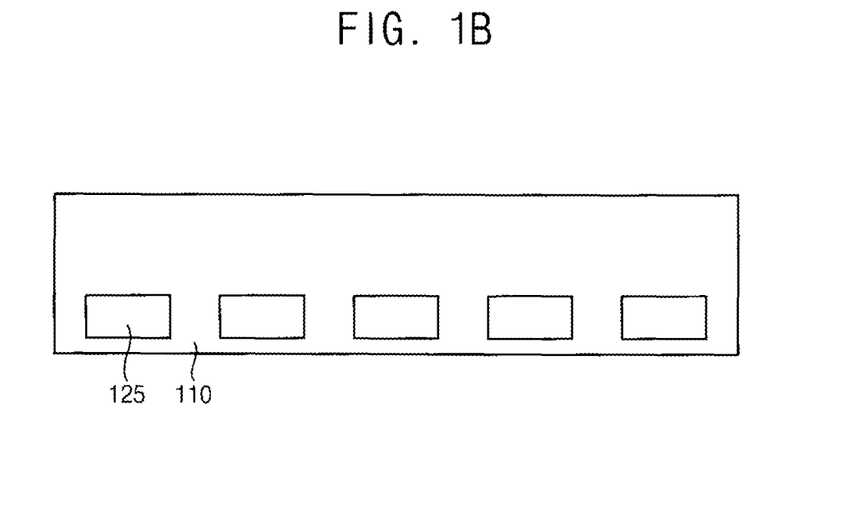
FIG. 1B is a plan view illustrating a printed circuit board of FIG. 1A.
Figure 1C:
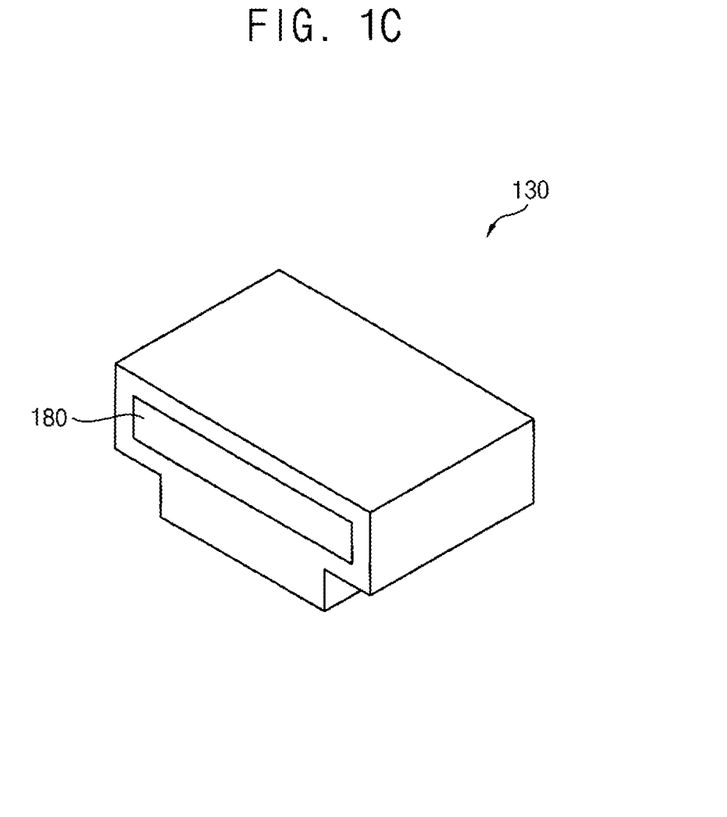
FIG. 1C is an enlarged perspective view illustrating a light emitting package of FIG. 1A.
Figure 2A:
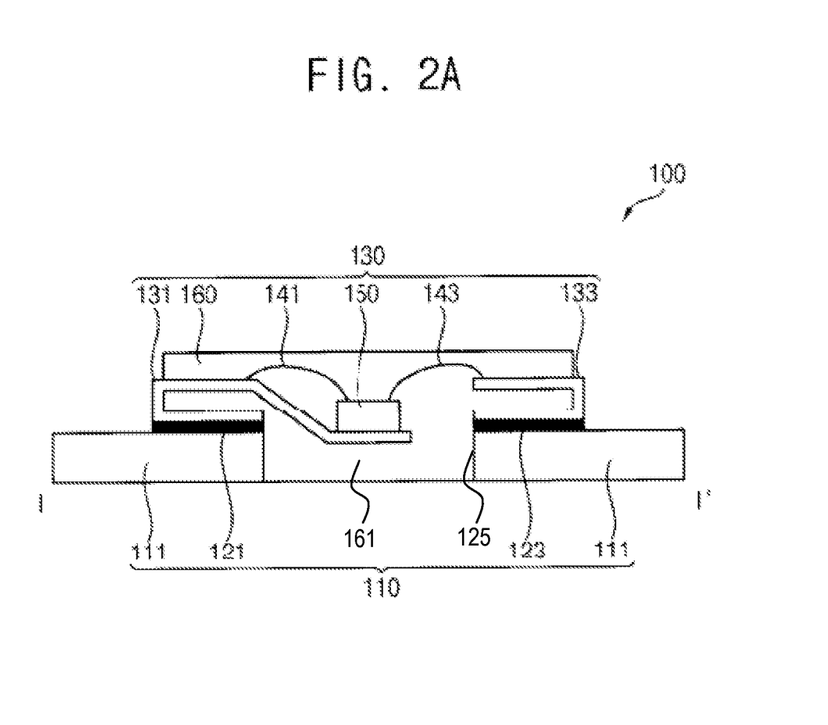
FIG. 2A is a cross-sectional view taken along a line I-I' of FIG. 1A.
Figure 2B:
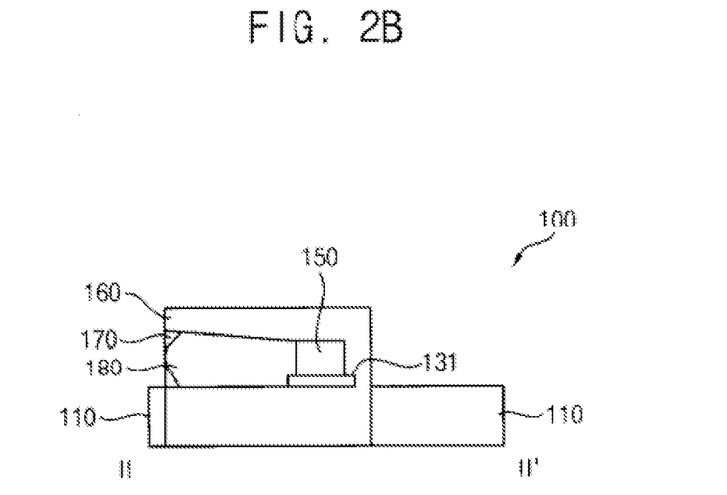
FIG. 2B is a cross-sectional view taken along a line II-II' of FIG. 1A.

FIG. 1A is a perspective view illustrating a light-emitting module according to an exemplary embodiment of the present invention, FIG. 1B is a plan view illustrating a printed circuit board 110 of FIG. 1A, FIG. 1C is an enlarged perspective view illustrating a light emitting package 130 of FIG. 1A, FIG. 2A is a cross-sectional view taken along a line I-I' of FIG. 1A and FIG. 2B is a cross-sectional view taken along a line II-II' of FIG. 1A.

Referring to FIGS. 1 to 2B, the light-emitting module 100 includes a printed circuit board (PCB) 110 and a light emitting package 130.

The PCB 110 includes a base substrate 111, a first wire layer 121 and a second wire layer 123. A hole 125 is formed through the PCB 110.

For example, the PCB 110 may be a flexible printed circuit board (FPCB) having a ductility. Alternatively, the PCB 110 may be a metal core printed circuit board (MCPCB) for transferring heat.

The first wire layer 121 is disposed on the base substrate 111 and supplies a first driving power. The second wire layer 123 is disposed on the base substrate 111, is spaced apart from the first wire layer 121, and supplies a second driving power.

A polarity of the second driving power supplied by the second wire layer 123 may be different from a polarity of the first driving power supplied by the first wire layer 121. For example, the polarity of the first driving power supplied by the first wire layer 121 may be a positive (+) and the polarity of the second driving power supplied by the second wire layer 123 may be a negative (−). Alternatively, the polarity of the first driving power supplied by the first wire layer 121 may be a negative (−) and the polarity of the second driving power supplied by the second wire layer 123 may be a positive (+).

The light emitting package 130 includes a first lead 131, a second lead 133, a light source 150, a first wire 141, a second wire 143, a protecting material 160 and an encapsulation portion 170.

The first lead 131 is disposed on the first wire layer 121. The light source 150 is disposed on the first lead 131, and a height of the first lead 131 on which the light source 150 is disposed is lower than an upper surface of the first lead 131 on which the light source 150 is not disposed. For example, the first lead 131 includes main lead portion extending in a first direction, a first bending portion extending downwardly from the main lead portion and a second bending portion extending parallel to the main lead portion at the end of the first bending portion. The light source 150 is disposed on the second bending portion. The second lead 133 is disposed on the second wire layer 123. The first lead 131 and the second lead 133 are spaced apart from each other and face each other. Each of the first lead 131 and the second lead 133 may have a 'C' shape.

The protecting material 160 is formed to protect the light source 150. The protecting material 160 has a stepped portion 161 to be disposed in the hole 125 formed through the PCB 110. The stepped portion 161 is formed at least below the light source 150. The height of the stepped portion 161 is approximately equal to a total thickness of the first lead 131 and the PCB 110. A thickness of the protecting material 160 on an upper surface of the light source 150 and on a lower surface of the light source 150 may be substantially the same. Alternatively, the thickness of the protecting material 160 on the upper surface of the light source 150 and on a lower surface of the first lead 131 on which the light source 150 is disposed may be substantially the same. However, the invention is not limited thereto. For example, it is noted that the thickness of the protecting material 160 on the upper surface of the light source 150, the thickness of the protecting material 160 on the lower surface of the light source 150 and the thickness of the protecting material 160 on the first lead 131 on which the light source 150 is disposed may be changed according to a structure of the light-emitting module 100 such as a thickness of the PCB 110, a thickness of a light guide plate and a thickness of a reflection sheet in a backlight assembly including the light-emitting module 100.

In addition, the protecting material 160 forms a receiving space in which the light source 150 is disposed between the first lead 131 and the second lead 133. Thus, the protecting material 160 covers the light source 150 and protects the light source 150. In addition, the protecting material 160 includes a groove formed in a direction that the light source 150 emits light. The protecting material 160 may be a mold compound.

The light source 150 is disposed on the first lead 131. In addition, at least a portion of the light source 150 may be disposed in the hole 125 formed through the PCB 110.

The light source 150 receives the first driving power transmitted by the first wire layer 121 of the PCB 110 and the second driving power transmitted by the second wire layer 123 of the PCB 110.

For example, the light source 150 may be electrically connected with the first lead 131 formed on the first wire layer 121 through the first wire 141. Thus, a first opening portion exposing the first lead 131 connected with the first wire 141 may be formed. In addition, the light source 150 may be electrically connected with the second lead 133 formed on the second wire layer 123 through the second wire 143. Thus, a second opening portion exposing the second lead 133 connected with the second wire 143 may be formed.

The light source 150 may emit the light in a horizontal direction to the PCB 110. Thus, the light source 150 may emit the light from a side surface of the light-emitting package 130. For example, the light source 150 may be a light emitting diode (LED).

The encapsulation portion 170 encapsulates the light source 150 to protect the light source 150. For example, the encapsulation portion 170 may include an epoxy material. In addition, the encapsulation portion 170 may further include a fluorescent material 180.

FIG. 3A to 3E are cross-sectional views illustrating a method of manufacturing the light-emitting module 100 in FIGS. 1A to 2B.

Figure 3A:
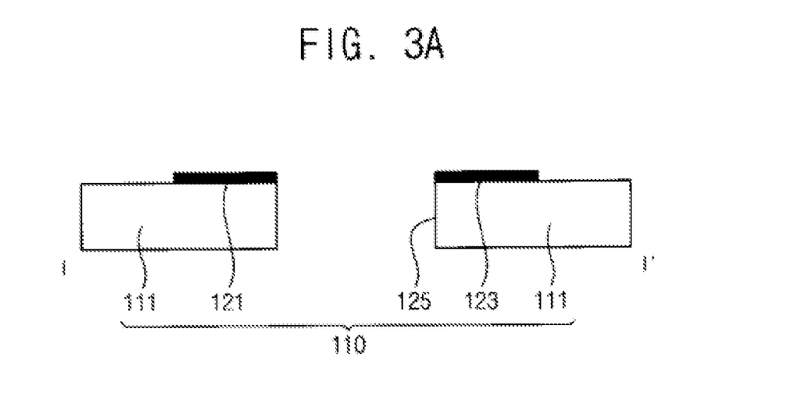
FIG. 3A to 3E are cross-sectional views illustrating a method of manufacturing the light-emitting module in FIGS. 1A to 2B.

Referring to FIG. 3A, the hole 125 is formed through the PCB 110. The PCB 110 includes the base substrate 111, the first wire layer 121 and the second wire layer 123 formed on the base substrate 110. The first wire layer 121 is disposed on the base substrate 111 and supplies the first driving power. The second wire layer 123 is disposed on the base substrate 111, is spaced apart from the first wire layer 121, and supplies the second driving power.

Figure 3B:
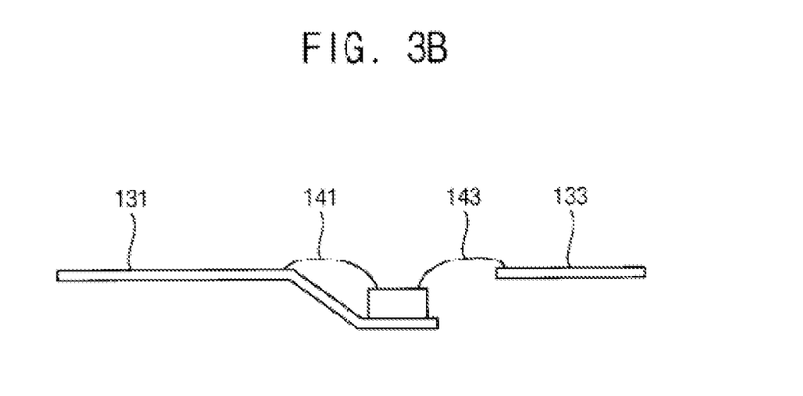

Referring to FIG. 3B, the light emitting package 130 is formed separately from the PCB 110. Specifically, a lead frame having the first lead 131 and the second lead 133 are arranged, and the light source 150 is disposed on the first lead 131. The light source 150 may be adhered to the first lead 131 through an adhesive material. The height of the first lead 131 on which the light source 150 is disposed is lower than the upper surface of the first lead 131 on which the light source 150 is not disposed. The first lead 131 and the second lead 133 are spaced apart from each other and face each other.

The first lead 131 and the light source 150 are electrically connected with each other through the first wire 141, and the second lead 133 and the light source 150 are electrically connected with each other through the second wire 143.

Figure 3C:
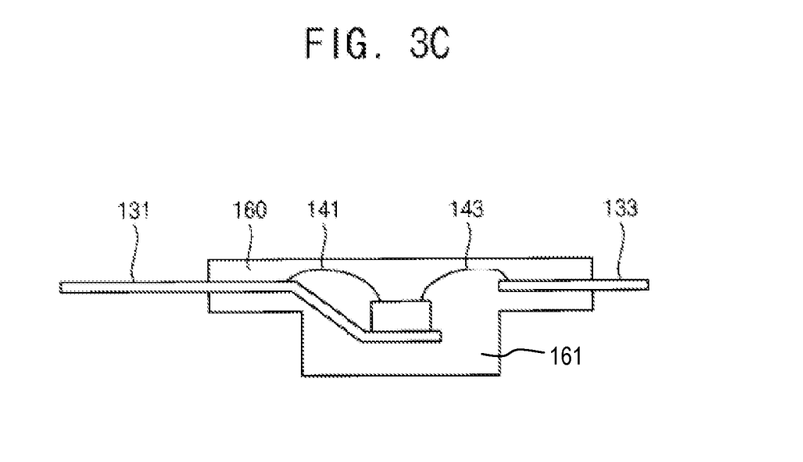

Referring to FIG. 3C, the protecting material 160 is formed. The protecting material 160 is formed between the first lead 131 and the second lead 133. In addition, the protecting material 160 includes a stepped portion 161 to be inserted into the hole 125 formed through the PCB 110. The hole 125 forms the receiving space in which the light source 150 is disposed between the first lead 131 and the second lead 133.

Figure 3D:
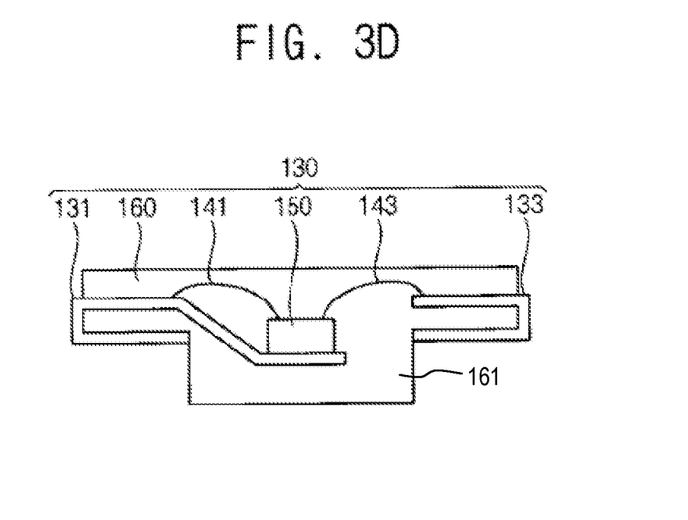

Referring to FIG. 3D, after cutting the lead frame, the first lead 131 and the second lead 133 are bent. Specifically, the first lead 131 and the second lead 133 are bent so that the first lead 131 and the second lead 133 cover a portion of the protecting material 160 on the opposite side of the upper surface of the first lead 131 and the second lead 133. Thus, the light emitting package 130 is formed.

Figure 3E:
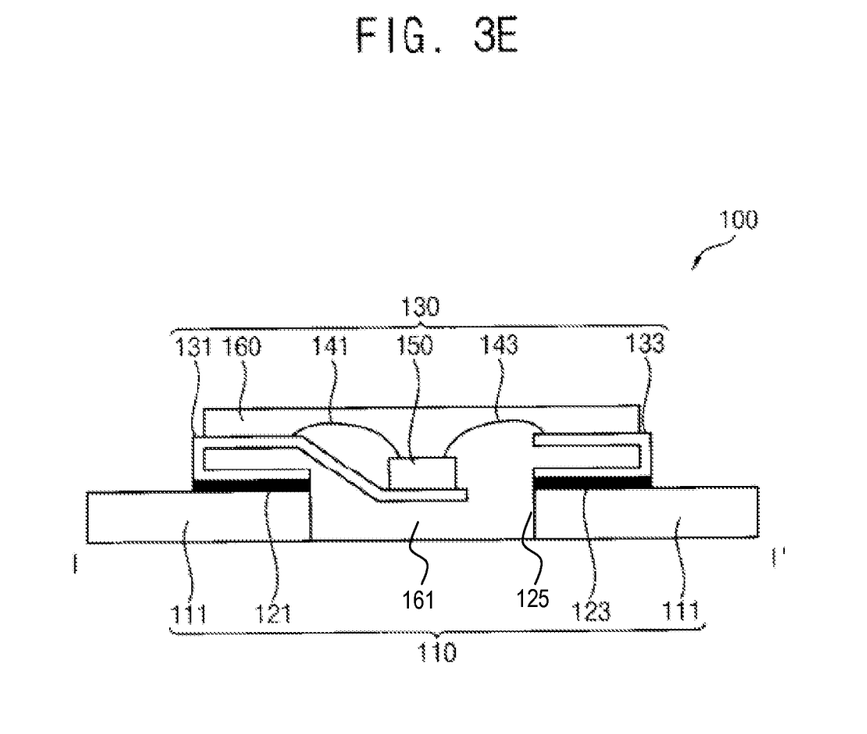

Referring to FIG. 3E, the light emitting package 130 is disposed on the PCB 110.

Specifically, the light emitting package 130 is disposed on the PCB 110 so that the stepped portion 161 of the protecting material 160 is inserted into the hole 125 of the PCB 110, the first lead 131 is connected with the first wire layer 121 and the second lead 133 is connected with the second wire layer 123. Thus, the light-emitting module 100 is formed.

Figure 4:
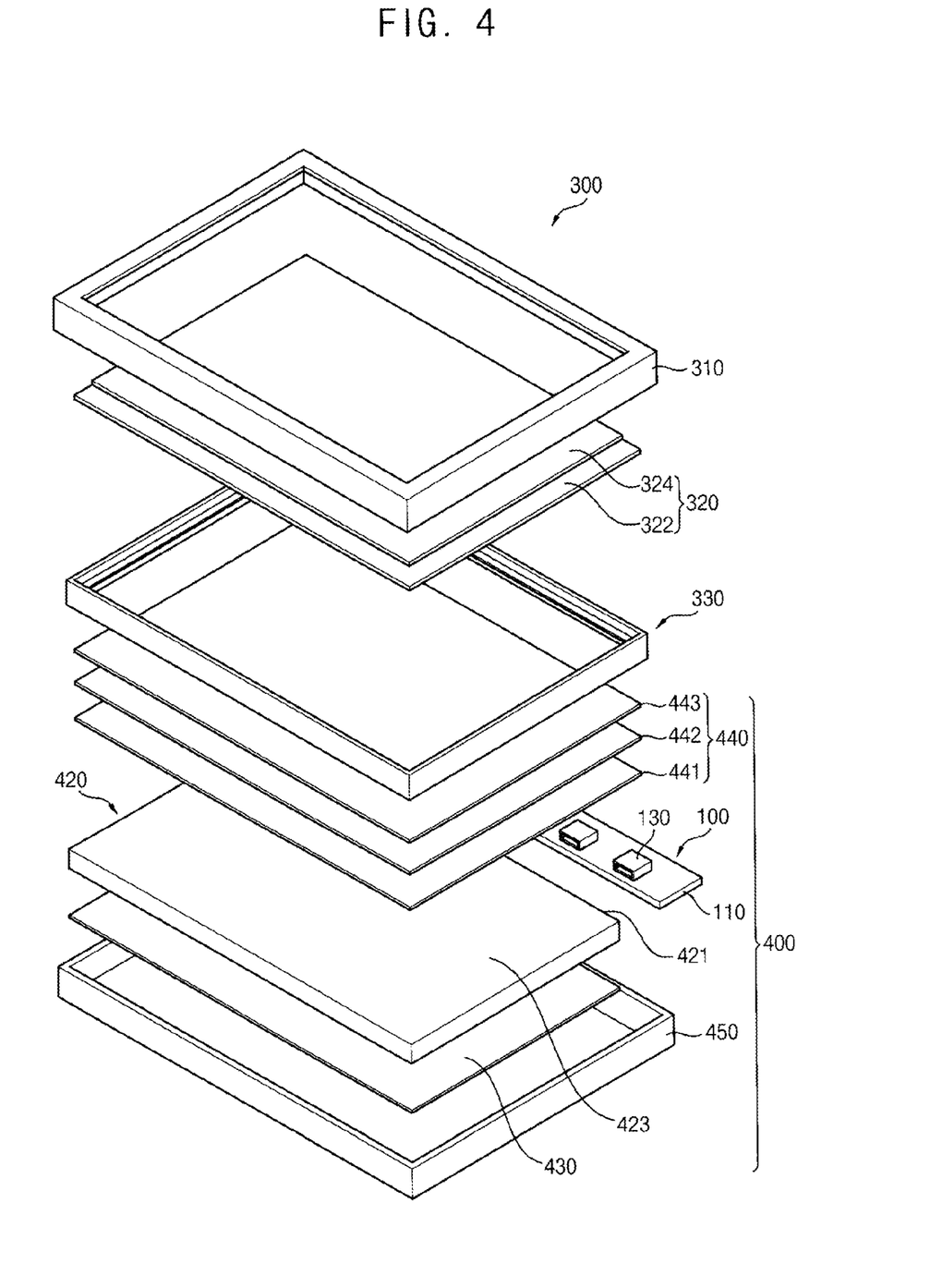
FIG. 4 is an exploded perspective view illustrating a display apparatus including the light-emitting module of FIGS. 1A to 2B.

FIG. 4 is an exploded perspective view illustrating a display apparatus including the light-emitting module 100 of FIGS. 1A to 2B.

Referring to FIG. 4, the display apparatus 300 includes an upper receiving container 310, a display panel 320, a mold frame and a backlight assembly 400.

The upper receiving container 310 is disposed over the display panel 320 to protect the display panel 320 from an external impact, and a window is formed through the upper receiving container 310 to expose a display area of the display panel 320.

The display panel 320 includes a thin-film transistor substrate 322, an opposite substrate 324 and a liquid crystal layer (not shown). The thin-film transistor substrate 322 or the opposite substrate 324 may include a color filter.

The thin-film transistor substrate 322 includes a first base substrate, a thin-film transistor and a pixel electrode. The opposite substrate 324 faces the thin-film transistor substrate 322. The opposite substrate 324 includes a second base substrate and a common electrode. The liquid crystal layer is interposed between the thin-film transistor substrate 322 and the opposite substrate 324, and a liquid crystal of the liquid crystal layer is aligned by an electric field generated between the pixel electrode of the thin-film transistor substrate 322 and the common electrode of the opposite substrate 324. The display panel 320 displays an image using a light emitted from a light exiting surface 423 of a light guide plate 420 of the backlight assembly 400.

The backlight assembly 400 is disposed under the display panel 320 to provide the light to the display panel 320. The backlight assembly 400 includes the light-emitting module 100, the light guide plate 420, a reflection sheet 430, optical sheets 440 and a lower receiving container 450.

The light-emitting module 100 includes the PCB 110 and the light emitting package 130. The light-emitting module 100 is substantially the same as the light-emitting module of FIGS. 1 to 2B. Thus, any further repetitive explanation concerning the above elements will be omitted.

The light guide plate 420 is disposed at a side of the light-emitting module 100. The light guide plate 420 includes a side surface 421 into which the light is incident and a light exiting surface 423 through which the light incident from the side surface exits to the display panel 320.

The reflection sheet 430 is disposed between the light guide plate 420 and the lower receiving container 450 to reflect light leaking from the light guide plate 420.

The optical sheets 440 are disposed over the light guide plate 420 to enhance an efficiency of the light exiting from the light guide plate 420. The optical sheets 440 may include a first optical sheet 441, a second optical sheet 442 and a third optical sheet 443. The first optical sheet 441, the second optical sheet 442 and the third optical sheet 443 may be a diffusion sheet, a prism sheet and a light-condensing sheet respectively.

The lower receiving container 450 is combined with the upper receiving container 310 to receive the reflection sheet 430, the light guide plate 420, the light-emitting module 100, the optical sheets 440 and the display panel 320.

The display apparatus 300 may further include a mold frame 330. The mold frame 330 is disposed between the display panel 320 and the optical sheets 340 to support the display panel 320, and the mold frame 330 fixes the light guide plate 420, the optical sheets 440 and the reflection sheet 430 to the lower receiving container 450.

According to the present exemplary embodiment, the hole 125 is formed through the PCB 110. The first lead 131 on which the light source 150 is disposed is positioned in the hole 125. A thickness of the light-emitting module 100 may be decreased while maintaining the thickness of the protecting material 160 on an upper surface of the light source 150 and on a lower surface of the light source 150. As a result, reliability of the light-emitting module 100 may be enhanced. In addition, a thickness of the backlight assembly 400 including the light-emitting module 100 and a thickness of the display apparatus 300 including the light-emitting module 100 may be decreased.

Figure 5A:
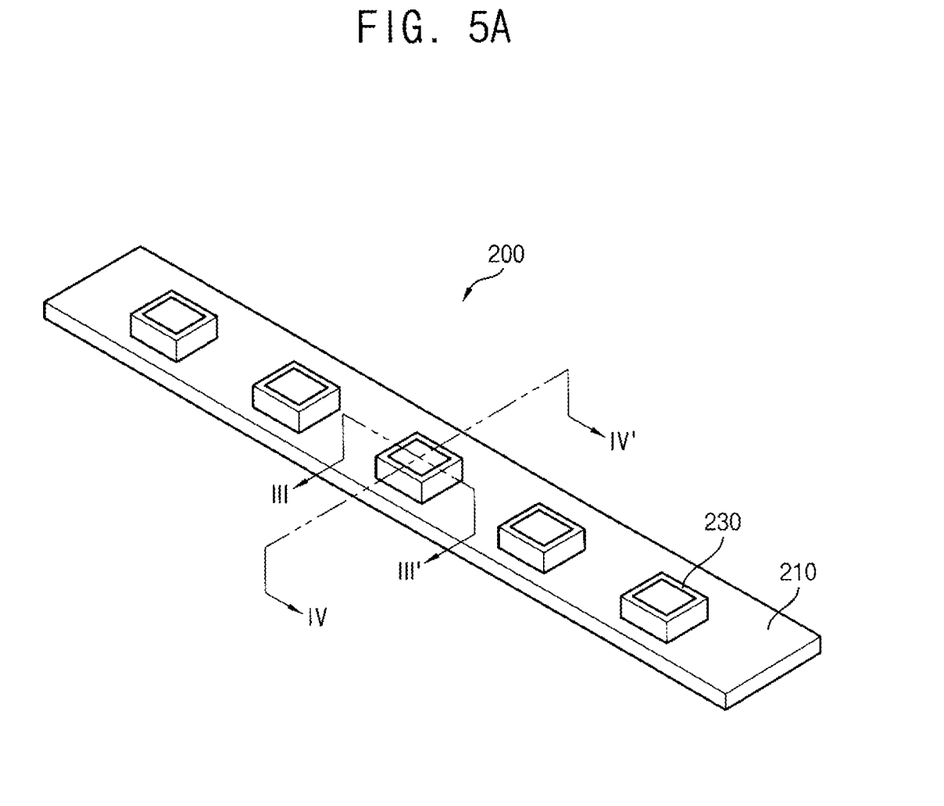
FIG. 5A is a perspective view illustrating a light-emitting module according to another example embodiment of the present invention.
Figure 5B:
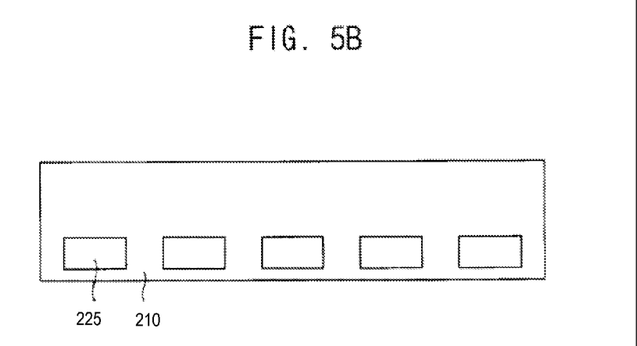
FIG. 5B is a plan view illustrating a printed circuit board of FIG. 5A.
Figure 5C:
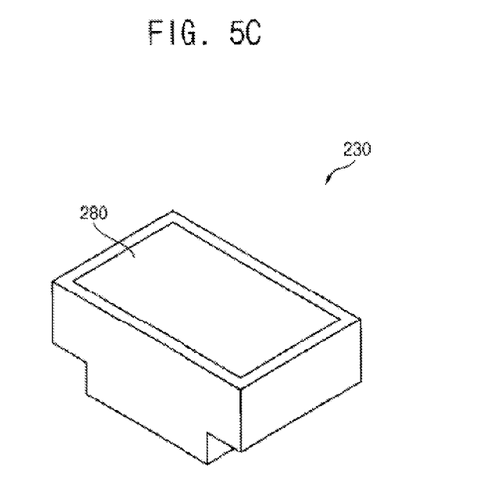
FIG. 5C is an enlarged perspective view illustrating a light emitting package of FIG. 5A.
Figure 6A:
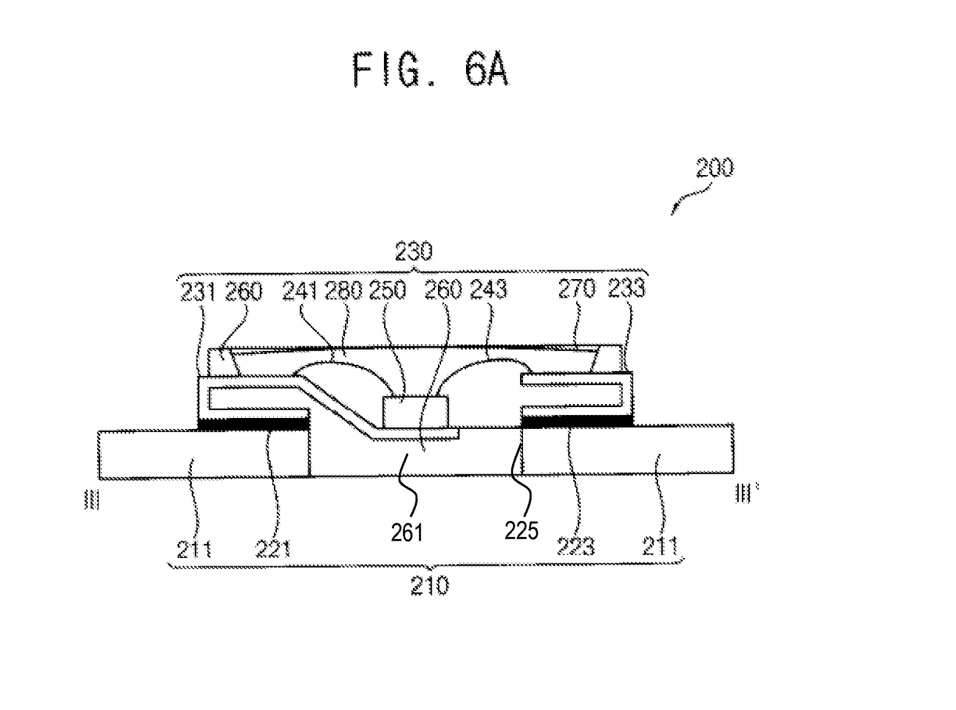
FIG. 6A is a cross-sectional view taken along a line III-III' of FIG. 5A.
Figure 6B:
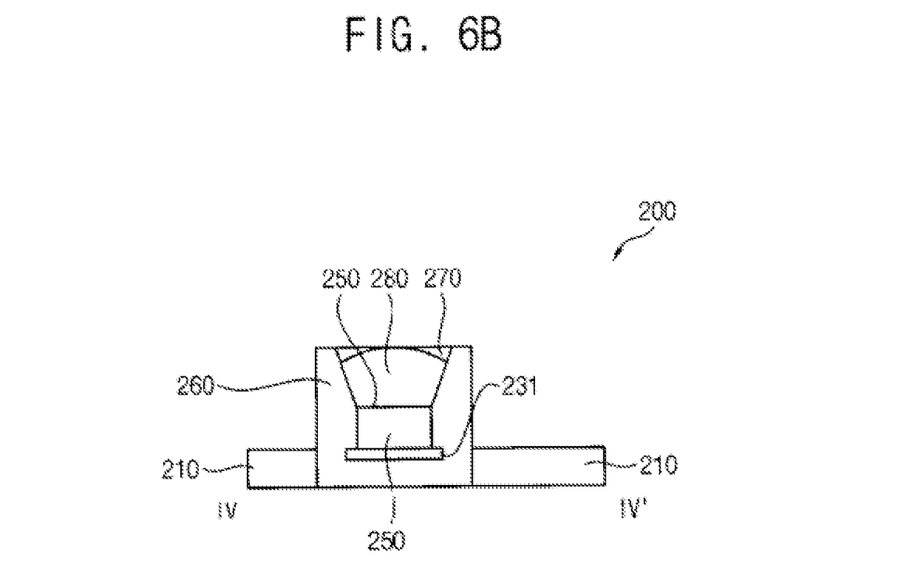
FIG. 6B is a cross-sectional view taken along a line IV-IV' of FIG. 5A.

FIG. 5A is a perspective view illustrating a light-emitting module 200 according to another exemplary embodiment of the present invention, FIG. 5B is a plan view illustrating a printed circuit board 210 of FIG. 5A, FIG. 5C is an enlarged perspective view illustrating a light emitting package 230 of FIG. 5A, FIG. 6A is a cross-sectional view taken along a line III-III' of FIG. 5A and FIG. 6B is a cross-sectional view taken along a line IV-IV' of FIG. 5A.

Referring to FIGS. 5A to 6B, the light-emitting module 200 includes a printed circuit board (PCB) 210 and a light emitting package 230.

The PCB 210 includes a base substrate 211, a first wire layer 221 and a second wire layer 223 formed on the base substrate 211. A hole 225 is formed through the PCB 210.

The PCB 210 may be a flexible printed circuit board (FPCB) having a ductility. Alternatively, the PCB 210 may be a metal core printed circuit board (MCPCB) for transferring heat.

The first wire layer 221 is disposed on the base substrate 211 and supplies a first driving power. The second wire layer 223 is disposed on the base substrate 211, is spaced apart from the first wire layer 221, and supplies a second driving power.

A polarity of the second driving power transmitted by the second wire layer 223 may be different from a polarity of the first driving power transmitted by the first wire layer 221. For example, the polarity of the first driving power transmitted by the first wire layer 221 may be a positive (+) and the polarity of the second driving power transmitted by the second wire layer 223 may be a negative (−). Alternatively, the polarity of the first driving power transmitted by the first wire layer 221 may be a negative (−) and the polarity of the second driving power transmitted by the second wire layer 223 may be a positive (+).

The light emitting package 230 includes a lead frame having a first lead 231, a second lead 233, a light source 250, a first wire 241, a second wire 243, a protecting material 260 and an encapsulation portion 270.

The first lead 231 is disposed on the first wire layer 221. The light source 250 is disposed on the first lead 231, and a height of the first lead 231 on which the light source 250 is disposed is lower than an upper surface of the first lead 231 on which the light source 250 is not disposed. For example, the first lead 231 includes main lead portion extending in a first direction, a first bending portion extending downwardly from the main lead portion and a second bending portion formed at the end of the first bending portion and extending parallel to the main lead portion. The light source 250 is disposed on the second bending portion. The second lead 233 is disposed on the second wire layer 223. The first lead 231 and the second lead 233 are spaced apart from each other and face each other. Each of the first lead 231 and the second lead 233 may have a 'C' shape.

The protecting material 260 is formed to protect the light source 250. The protecting material 260 has a stepped portion to be disposed in the hole 225 formed through the PCB 210. The stepped portion is formed at least below the light source 250. The height of the stepped portion is substantially same to a total thickness of the first lead 231 and the PCB 210. A thickness of the protecting material 260 above an upper surface of the light source 250 and below a lower surface of the light source 250 may be substantially same. Alternatively, the thickness of the protecting material 260 above the upper surface of the light source 250 and below a lower surface of the first lead 231 on which the light source 250 is disposed may be substantially same. However, it is not limited thereto. The thickness of the protecting material 260 above the upper surface of the light source 250, the thickness of the protecting material 260 below the lower surface of the light source 250, and the thickness of the protecting material 260 on the first lead 231 on which the light source 250 is disposed, may be changed according to a structure of the light-emitting module 200 such as a thickness of the PCB 210, a thickness of a light guide plate, and a thickness of a reflection sheet in a backlight assembly including the light-emitting module 200.

In addition, the protecting material 260 forms a receiving space in which the light source 250 is disposed between the first lead 231 and the second lead 233. Thus, the protecting material 260 covers the light source 250 and protects the light source 250. In addition, the protecting material 260 includes a groove formed in a direction that the light source 250 emits light. The protecting material may be a mold compound.

The light source 250 is disposed on the first lead 231. In addition, at least a portion of the light source 250 may be disposed in the hole 225 formed through the PCB 210.

The light source 250 receives the first driving power supplied by the first wire layer 221 of the PCB 210 and the second driving power supplied by the second wire layer 223 of the PCB 210.

For example, the light source 250 may be electrically connected with the first lead 231 formed on the first wire layer 221 through the first wire 241. The light source 250 may be electrically connected with the second lead 233 formed on the second wire layer 223 through the second wire 243.

The light source 250 may emit the light in a vertical direction to an upper surface of the PCB 210. Thus, the light source 250 may emit the light from a top surface of the light-emitting module 200. For example, the light source 250 may be a light emitting diode (LED).

The encapsulation portion 270 encapsulates the light source 250 to protect the light source 250. For example, the encapsulation portion 270 may include an epoxy material. In addition, the encapsulation portion 270 may further include a fluorescent material 280.

FIG. 7A to 7E are cross-sectional views illustrating a method of manufacturing the light-emitting module 200 in FIGS. 5A to 6B.

Figure 7A:
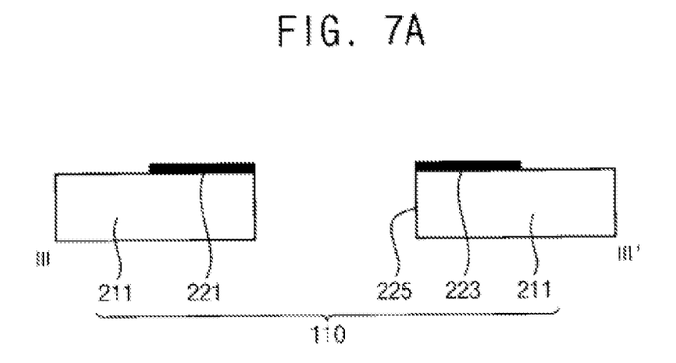
FIG. 7A to 7E are cross-sectional views illustrating a method of manufacturing the light-emitting module in FIGS. 5A to 6B.

Referring to FIG. 7A, the hole 225 is formed through the PCB 210. The PCB 210 includes the base substrate 211, the first wire layer 221 and the second wire layer 223 formed on the base substrate 210. The first wire layer 221 is disposed on the base substrate 211 and supplies the first driving power. The second wire layer 223 is disposed on the base substrate 211, is spaced apart from the first wire layer 221, and supplies the second driving power.

Figure 7B:
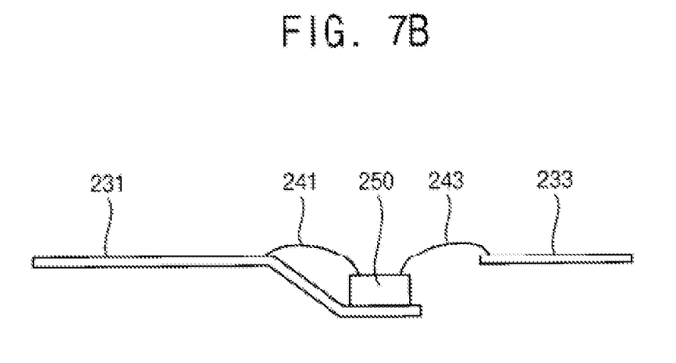

Referring to FIG. 7B, the light emitting package 230 is formed separately from the PCB 210. Specifically, the first lead 231 and the second lead 233 are arranged, and the light source 250 is disposed on the first lead 231. The light source 250 may be adhered to the first lead 231 through an adhesive material. The upper surface of the first lead 231 on which the light source 250 is disposed is lower than the upper surface of the first lead 231 on which the light source 250 is not disposed. The first lead 231 and the second lead 233 are spaced apart from each other and face each other.

The first lead 231 and the light source 250 are electrically connected with each other through the first wire 241, and the second lead 233 and the light source 250 are electrically connected with each other through the second wire 243.

Figure 7C:
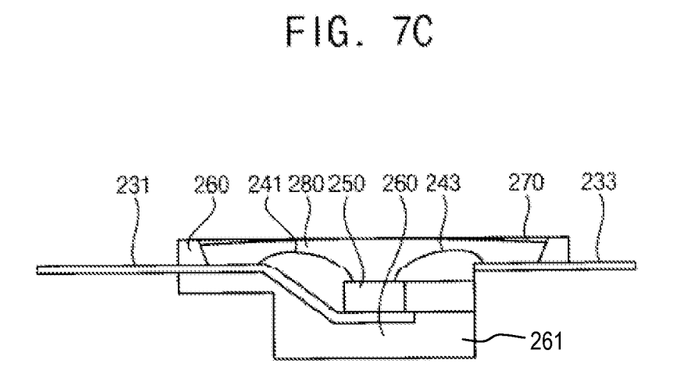

Referring to FIG. 7C, the protecting material 260 is formed. The protecting material 260 is formed between the first lead 231 and the second lead 233. In addition, the protecting material 260 includes a stepped portion 261 to be inserted into the hole 225 in the PCB 210. The hole 225 forms the receiving space in which the light source 250 is disposed between the first lead 231 and the second lead 233.

Figure 7D:
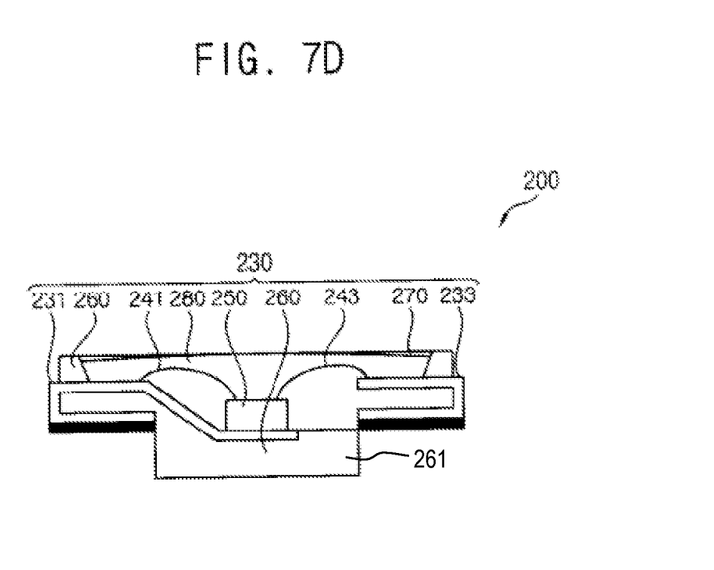

Referring to FIG. 7D, after cutting the lead frame, the first lead 231 and the second lead 233 are bent. Specifically, the first lead 231 and the lead are bent so that the first lead 231 and the second lead 233 cover a portion of the protecting material 260 on the opposite side of the upper surface of the first lead 231 and the second lead 233. Thus, the light emitting package 230 is formed.

Figure 7E:
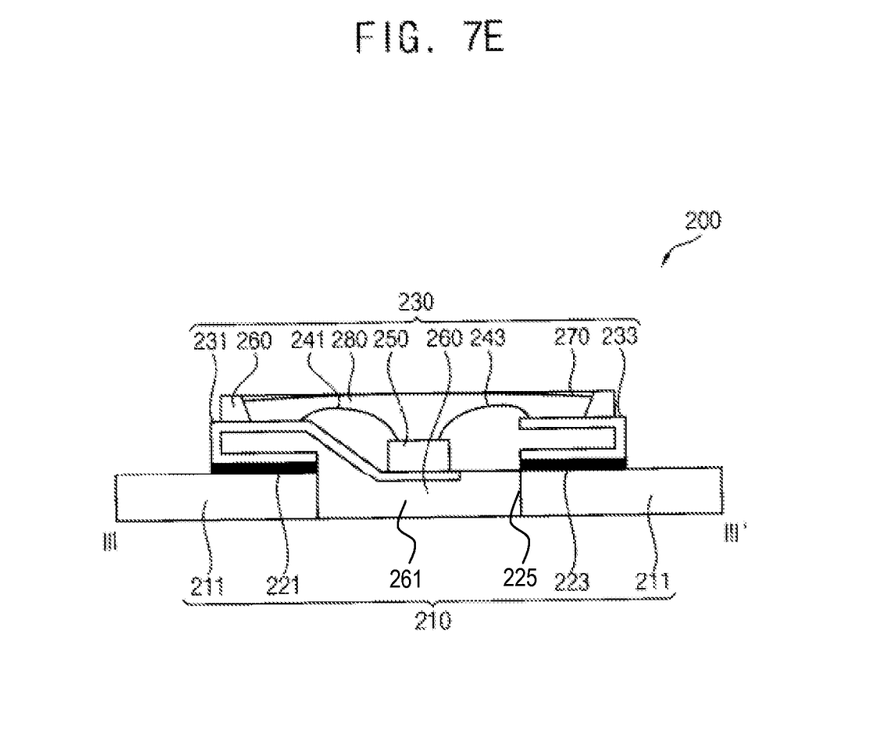

Referring to FIG. 7E, the light emitting package 230 is disposed on the PCB 210.

Specifically, the light emitting package 230 is disposed on the PCB 210 so that the stepped portion 261 of the protecting material 260 is inserted into the hole 225 of the PCB 210, the first lead 231 is connected with the first wire layer 221 and the second lead 233 is connected with the second wire layer 223. Thus, the light-emitting module 200 is formed.

Figure 8:
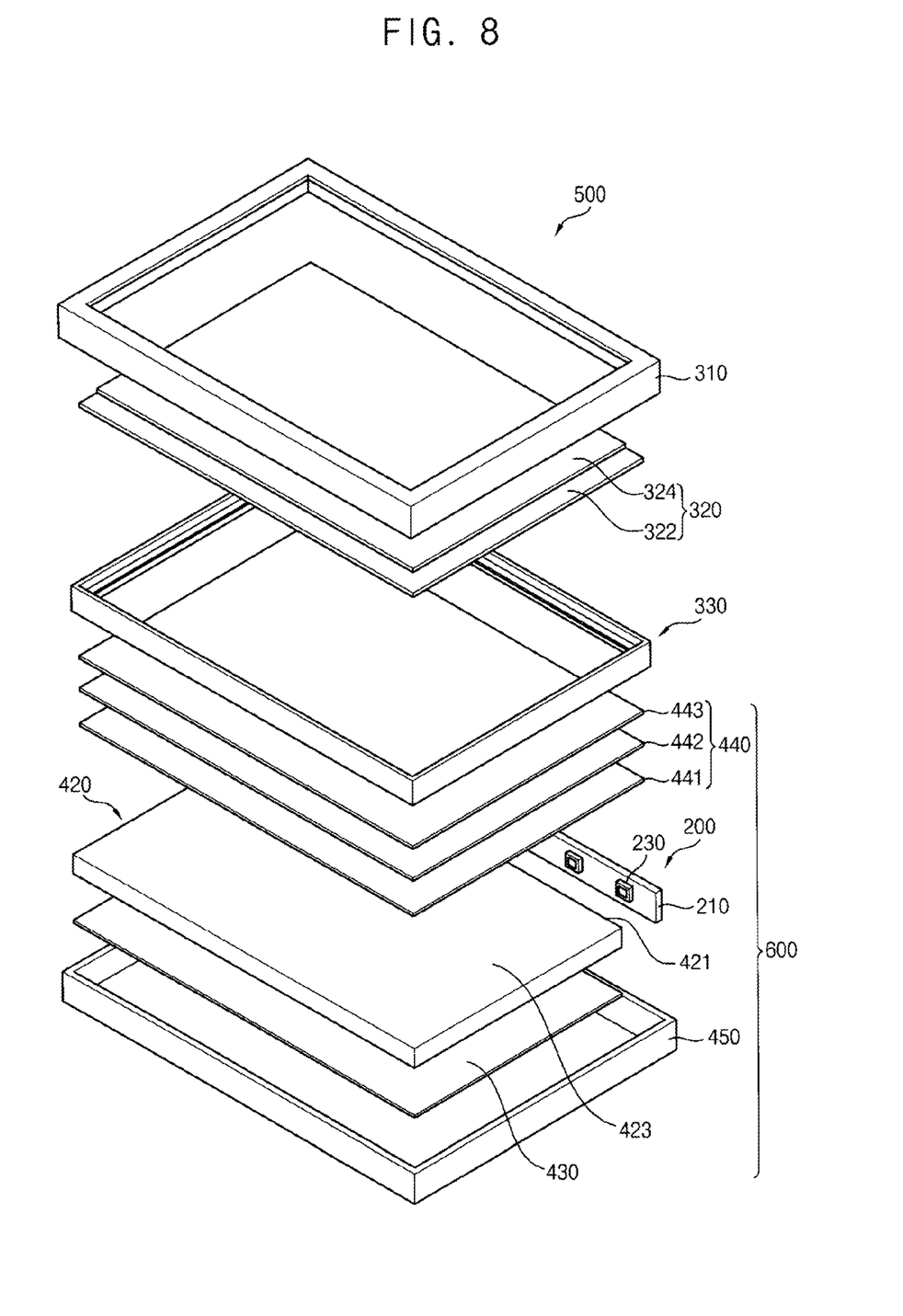
FIG. 8 is an exploded perspective view illustrating a display apparatus including the light-emitting module of FIGS. 5A to 6B.

FIG. 8 is an exploded perspective view illustrating a display apparatus including the light-emitting module 200 of FIGS. 5A to 6B.

Referring to FIG. 8, the display apparatus 500 includes an upper receiving container 310, a display panel 320, mold frame 330 and a backlight assembly 600.

The upper receiving container 310 is disposed over the display panel 320 to protect the display panel 320 from an external impact, and a window is formed through the upper receiving container 310 to expose a display area of the display panel 320.

The display panel 320 includes a thin-film transistor substrate 322, an opposite substrate 324 and a liquid crystal layer (not shown). The thin-film transistor substrate 322 or the opposite substrate 324 may include a color filter.

The thin-film transistor substrate 322 includes a first base substrate, a thin-film transistor and a pixel electrode. The opposite substrate 324 faces the thin-film transistor substrate 322. The opposite substrate 324 includes a second base substrate and a common electrode. The liquid crystal layer is interposed between the thin-film transistor substrate 322 and the opposite substrate 324, and a liquid crystal of the liquid crystal layer is aligned by an electric field generated between the pixel electrode of the thin-film transistor substrate 322 and the common electrode of the opposite substrate 324. The display panel 320 displays an image using a light emitted from a light exiting surface 423 of a light guide plate 420 of the backlight assembly 600.

The backlight assembly 600 is disposed under the display panel 320 to provide the light to the display panel 320. The backlight assembly 600 includes the light-emitting module 200, the light guide plate 420, a reflection sheet 430, optical sheets 440 and a lower receiving container 450.

The light-emitting module 200 includes the PCB 210 and the light emitting package 230. The light-emitting module 200 is substantially the same as the light-emitting module of FIGS. 5 to 6B. Thus, any further repetitive explanation concerning the above elements will be omitted.

The light guide plate 420 is disposed at a side of the light-emitting module 200. The light guide plate 420 includes a side surface 421 into which the light is incident and a light exiting surface 423 through which the light incident from the side surface exits to the display panel 320.

The reflection sheet 430 is disposed between the light guide plate 420 and the lower receiving container 450 to reflect light leaking from the light guide plate 420.

The optical sheets 440 are disposed over the light guide plate 420 to enhance an efficiency of the light exiting from the light guide plate 420. The optical sheets 440 may include a first optical sheet 441, a second optical sheet 442 and a third optical sheet 443, and for example, respective the first optical sheet 441, the second optical sheet 442 and the third optical sheet 443 may be a diffusion sheet, a prism sheet and a light-condensing sheet.

The lower receiving container 450 is combined with the upper receiving container 310 to receive the reflection sheet 430, the light guide plate 420, the light-emitting module 200, the optical sheets 440 and the display panel 320.

The display apparatus 500 may further include a mold frame 330. The mold frame 330 is disposed between the display panel 320 and the optical sheets 340 to support the display panel 320, and the mold frame 330 fixes the light guide plate 420, the optical sheets 440 and the reflection sheet 430 to the lower receiving container 450.

According to the present exemplary embodiment, the hole 225 is formed through the PCB 210, and the portion of the protecting material 260 and the portion of the light source 250 are disposed in the hole 225. Thus, a thickness of the light-emitting module 200 may be decreased, and reliability of the light-emitting module 200 may be enhanced. In addition, a thickness of the backlight assembly 400 including the light-emitting module 200 and a bezel of the display apparatus 500 including the light-emitting module 200 may be decreased.

According to the light-emitting module, a thickness of the light-emitting module may be decreased, reliability of the light-emitting module may be enhanced, and thus a thickness and a bezel of the display apparatus may be decreased.

The foregoing is illustrative of the present invention and is not to be construed as limiting thereof. Although a few example embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A light-emitting module comprising:
    a printed circuit board (PCB) through which a hole is formed; and
    a light emitting package having a light source and a lead, and disposed on the PCB,
    wherein a protecting material comprises a stepped portion and a top portion,
    wherein the stepped portion and a portion of the light source are disposed in the hole formed through the PCB,
    wherein a width of the top portion of the protecting material is greater than a width of the hole formed through the PCB,
    wherein the light source is covered by the protecting material and disposed in contact with the protecting material, and
    wherein the protecting material includes a groove extending through a portion of the protecting material and defining a path along which light from the light source travels.

2. The light-emitting module of claim 1,
    wherein the lead includes a main lead portion, a first bending portion extending downwardly from the main lead portion, and a second bending portion formed at an end of the first bending portion and extending parallel to the main lead portion, and wherein the light source is disposed on the second bending portion.

3. The light-emitting module of claim 2, wherein the stepped portion is at least formed below the light source.

4. The light-emitting module of claim 3, wherein a height of the stepped portion is substantially same as a total thickness of the lead and the PCB.

5. The light-emitting module of claim 1, wherein the stepped portion is at least formed below the light source.

6. The light-emitting module of claim 5, wherein a height of the stepped portion is substantially same as a total thickness of the lead and the PCB.

7. The light-emitting module of claim 1, wherein a height of the stepped portion is substantially same as a total thickness of the lead and the PCB.

8. The light-emitting module of claim 1, wherein a thickness of the protecting material on an upper surface of the light source and on a lower surface of the lighting source is substantially the same.

9. The light-emitting module of claim 8, wherein the light emitting package includes a lead frame, and the lead frame has a portion bent downwardly from the lead and has a portion parallel to the lead at the end of the portion bent downwardly, and
wherein the light source is disposed on the portion parallel to the lead.

10. The light-emitting module of claim 9, wherein the stepped portion is at least formed below the light source.

11. The light-emitting module of claim 10, wherein a height of the stepped portion is substantially same as a total thickness of the lead and the PCB.

12. The light-emitting module of claim 8, wherein the stepped portion is at least formed below the light source.

13. The light-emitting module of claim 12, wherein a height of the stepped portion is substantially same as a total thickness of the lead and the PCB.

14. The light-emitting module of claim 8, wherein a height of the stepped portion is substantially same as a total thickness of the lead and the PCB.

15. The light-emitting module of claim 1, wherein a thickness of the protecting material on an upper surface of the light source and on a lower surface of the lead is substantially the same.

16. The light-emitting module of claim 15, wherein the light emitting package includes a lead frame, and the lead frame has a portion bent downwardly from the lead and has a portion parallel to the lead at the end of the portion bent downwardly, and
wherein the light source is disposed on the portion parallel to the lead.

17. The light-emitting module of claim 16, wherein the stepped portion is at least formed below the light source.

18. The light-emitting module of claim 17, wherein a height of the stepped portion is substantially same as a total thickness of the lead and the PCB.

19. The light-emitting module of claim 15, wherein the stepped portion is at least formed below the light source.

20. The light-emitting module of claim 19, wherein a height of the stepped portion is substantially same as a total thickness of the lead and the PCB.

21. The light-emitting module of claim 15, wherein a height of the stepped portion is substantially same as a total thickness of the lead and the PCB.

* * * * *